United States Patent [19]

Linker et al.

[11] Patent Number: 4,787,426

[45] Date of Patent: * Nov. 29, 1988

[54] HIGH-SPEED ELECTRICAL COMPONENT LEAD FORMING APPARATUS AND METHOD

[75] Inventors: Frank V. Linker; Frank V. Linker, Jr., both of Broomall, Pa.

[73] Assignee: American Tech Manufacturing, Inc., Glenolden, Pa.

[*] Notice: The portion of the term of this patent subsequent to May 19, 2004 has been disclaimed.

[21] Appl. No.: 933,931

[22] Filed: Nov. 18, 1986

Related U.S. Application Data

[63] Continuation of Ser. No. 710,032, Mar. 11, 1985, Pat. No. 4,665,954.

[51] Int. Cl.$^4$ .............................................. B21F 1/02
[52] U.S. Cl. .............................................. 140/147
[58] Field of Search ............... 140/147, 105; 29/33 F, 29/37 M, 833, 838; 193/31 R, 31 A; 209/573, 655, 657

[56] References Cited

U.S. PATENT DOCUMENTS

| | | | |
|---|---|---|---|
| 4,103,719 | 8/1978 | Witt | 140/147 |
| 4,219,053 | 8/1980 | Tyner et al. | 140/147 |

Primary Examiner—Frederick R. Schmidt
Assistant Examiner—Robert Showalter
Attorney, Agent, or Firm—Eugene E. Renz, Jr.

[57] ABSTRACT

In apparatus for disposing DIP leads in a predetermined and preselected condition of straightness and orientation, a trackway for operatively supporting and moving DIPs therealong from a loading station to a discharge station, a forming station positioned along the trackway subsequent to said entrance station. The forming station includes laterally spaced rotatable forming rollers on opposite sides of the trackway, anvils confronting the inner faces of the leads between the forming rollers and anvils. The rollers and anvil having cooperating confronting surfaces adapted to engage the DIP leads adjacent the shoulder to the outer terminal ends, the forming rollers cooperatively associated with the anvils and spaced therefrom to define a nip gap. DIPs are moved through the nip gap whereby DIP leads are contacted to align them in predetermined orientation and at a predetermined angle relative to the body portion. The anvils are spring biased so that leads passing between the confronting surfaces the forming rollers and anvil creates a predetermined adjustable gap at the pointy of tangency of the forming rollers circumference and a DIP lead. This ensures the proper angle of divergence of each lead, removal of any adherent compound bending of a lead and ensures that each of the leads following preceding ones will fall within a common plane.

1 Claim, 8 Drawing Sheets

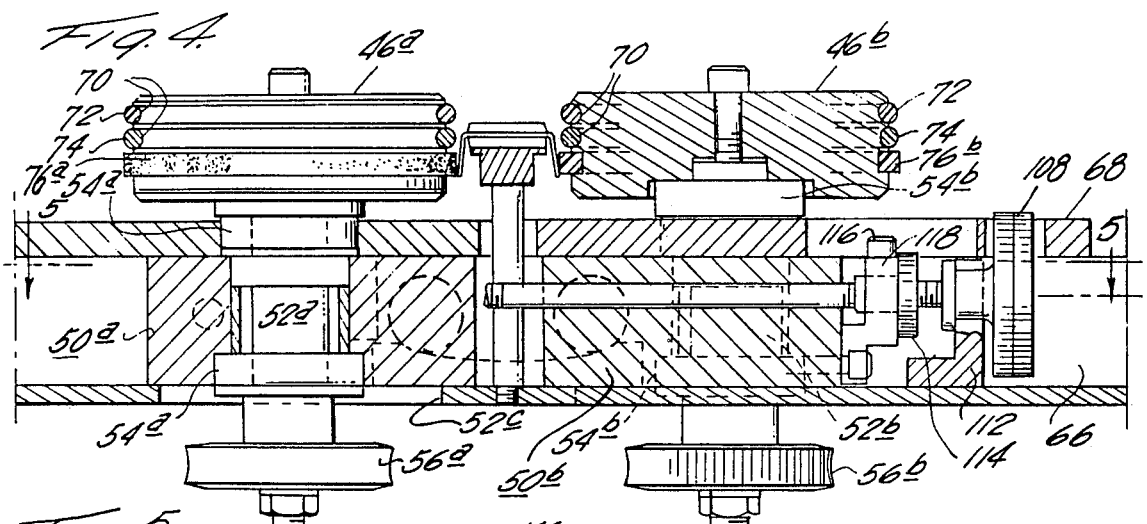
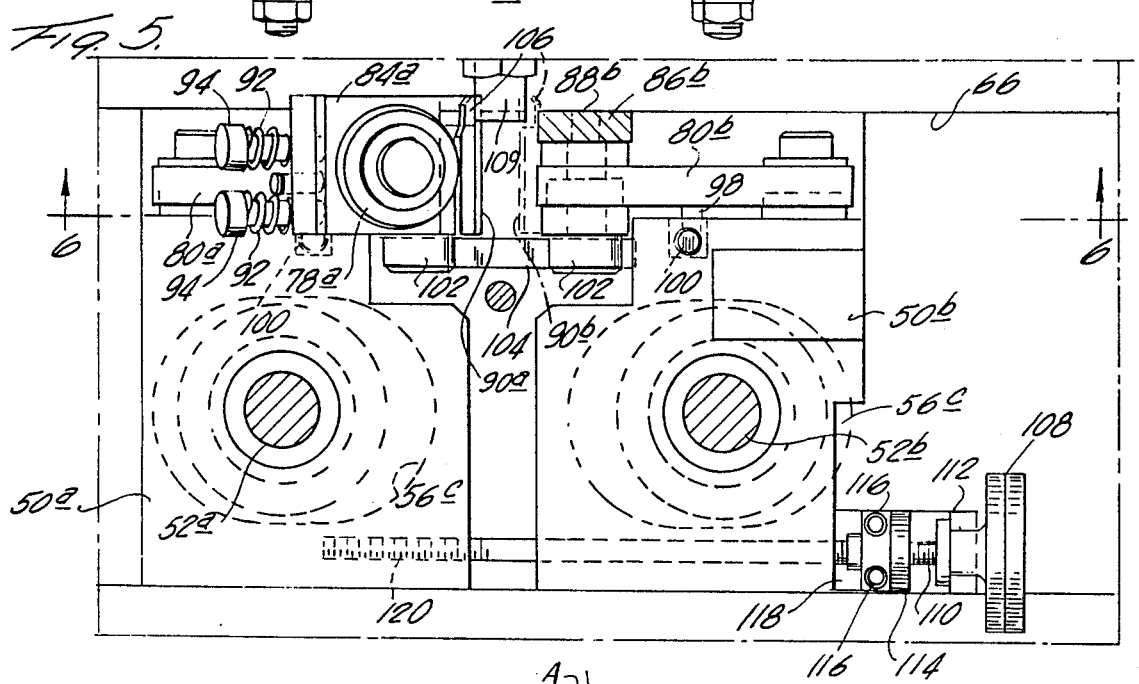
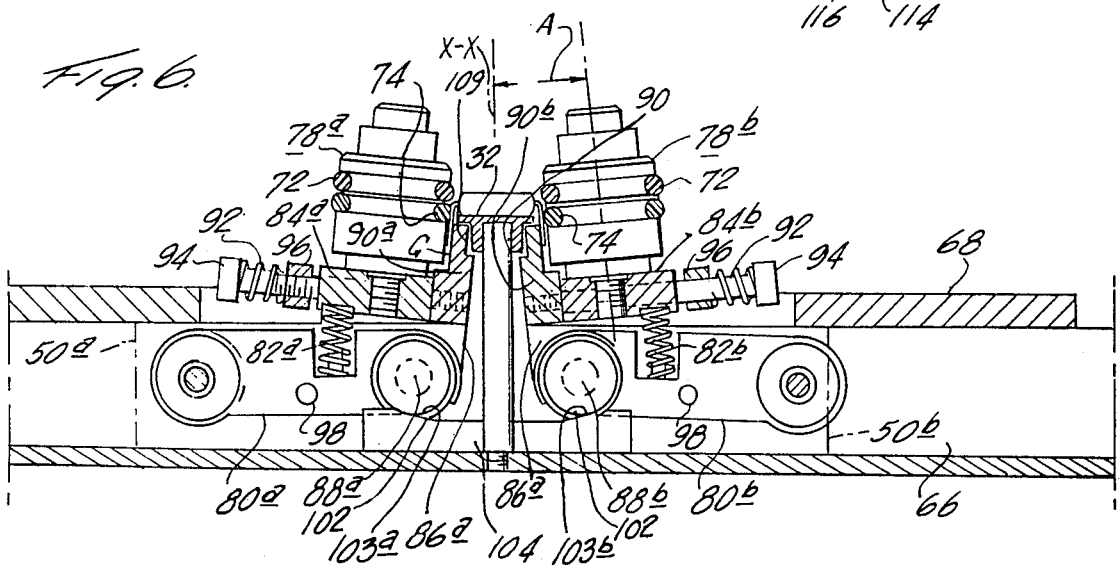

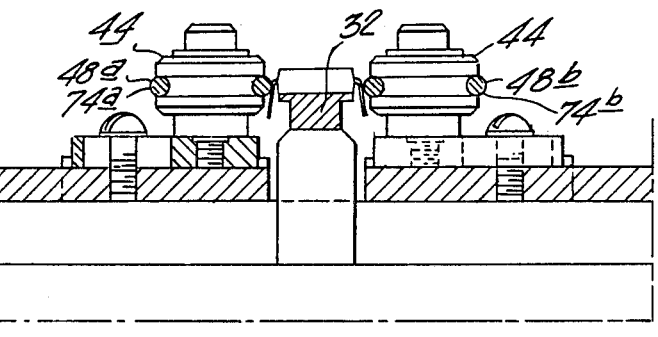
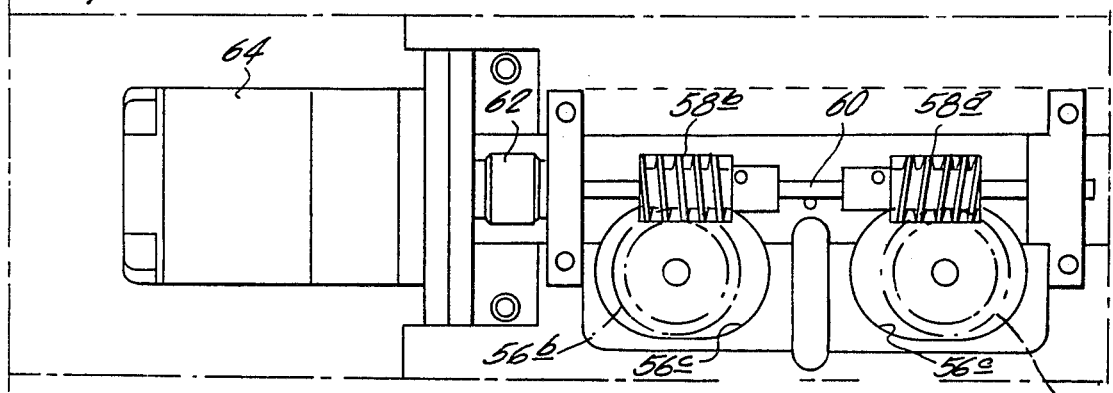
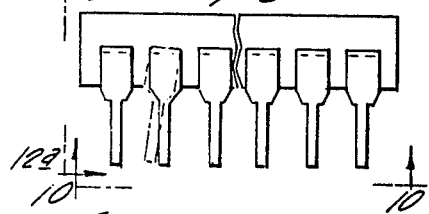
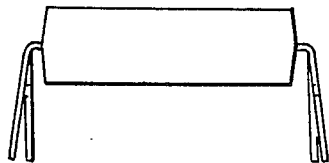
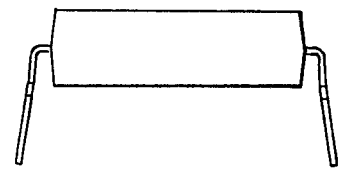
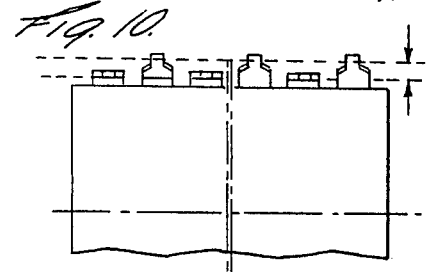
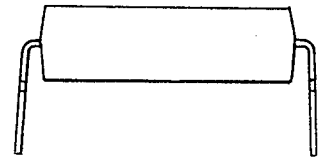
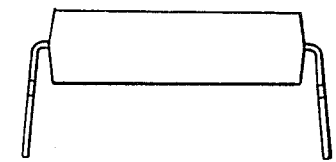
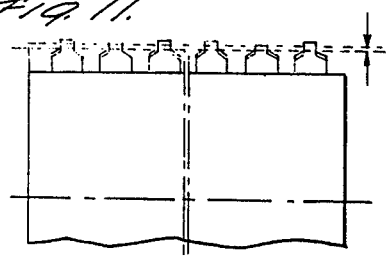

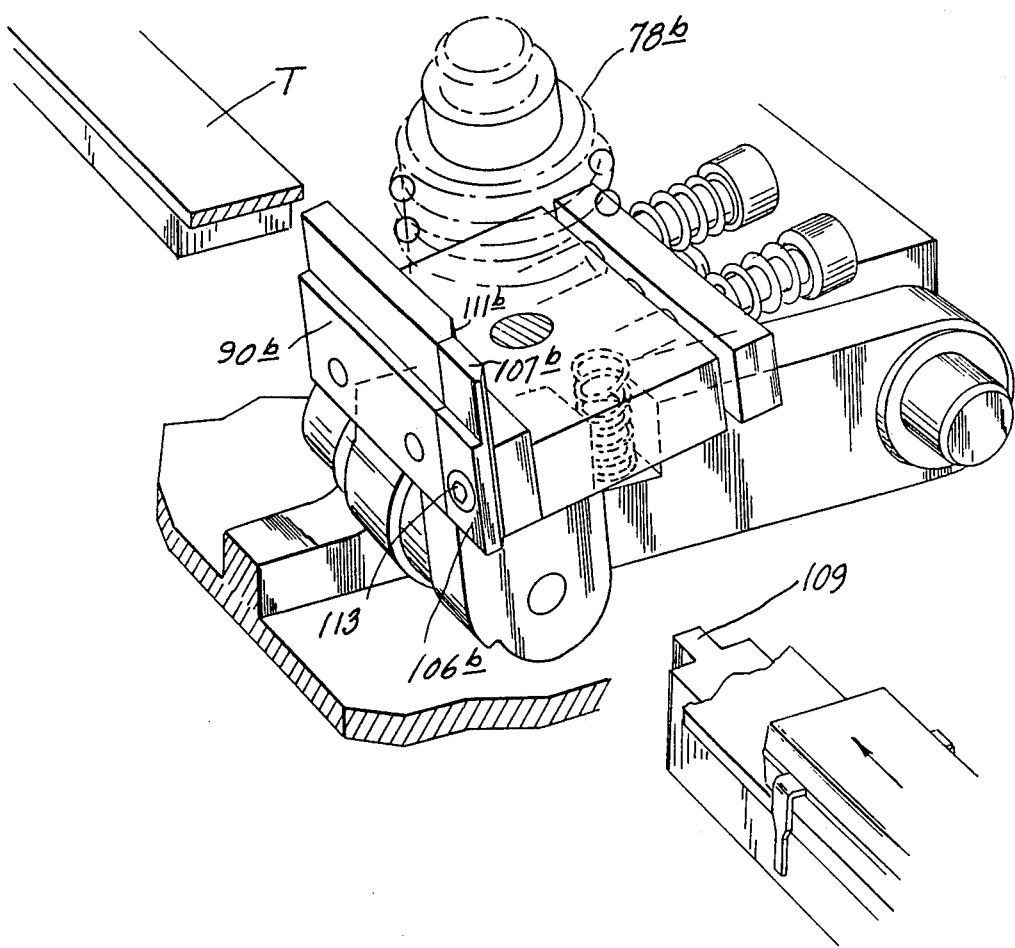

HIGH-SPEED ELECTRICAL COMPONENT LEAD FORMING APPARATUS AND METHOD

This is a continuation of application Ser. No. 06/710,032 filed on Mar. 11, 1985, now U.S. Pat. No. 4,665,954 and entitled HIGH-SPEED ELECTRONIC COMPONENT LEAD FORMING APPARATUS AND METHOD.

FIELD OF THE INVENTION

The present invention broadly relates to a new and improved method and apparatus for determining electronic component lead integrity and disposition. More specifically, the invention is directed to a novel system, apparatus and method for not only determining lead integrity of so-called dual-in-line package (DIP) devices, typically used for the assembly of integrated circuits on printed circuit boards (PCB), and other well known and used devices of numerous types, but includes a new and novel geometric lead forming apparatus to ensure that they conform to predetermined specifications.

DIP devices and other electronic devices, include a plurality of pin-like projections, or leads, which are relatively fragile and which have a tendency to bend, or otherwise become damaged during handling and shipment. Such damage can distort the leads from a given predetermined orientation, necessary for proper PCB installation. The predetermined orientation is designed to correspond to either the orientation of premounted socket members or to a plurality of openings in the PCB, such openings arranged in a predetermined pattern corresponding to the printed electric pattern on the circuit board base. Electronic components of this type typically comprise an elongated generally rectangular body portion, preferably made of molded materials, having operatively integrated therewith a plurality of pin-like leads arranged in rows on opposite side edges thereof and disposed, preferably at predetermined angular relations to the body portion, to facilitate interconnection with the patterned sockets of a PCB or the like. The particular configurations and method of attachment of the leads to the body portion can differ substantially, according to the different types of DIPs in question. The leads, for appropriate use in a PCB, require a lead disposition at a predetermined angle in relation to the body and in substantial parallel mutual relationship, one to another and in a straight line in lead succession. In practice, it is found that the leads can be so disoriented with respect to the body, and/or one to another, as to render it difficult, or sometimes impossible, to either manually, or by automatic insertion means, dispose the DIP within the predetermined pattern socket. Such disorientation can be in plural numerous planes whereas a predetermined orientation in each designed connection must be correctly aligned for a given predetermined orientation for PCB installation. It is necessary not only to determine the integrity or disposition of the leads prior to their attempted mounting, but also the DIP lead alignments in three planes or dispositions must be correct and within certain design limitations or tolerances in the various planes for proper association. The present invention is directed primarily to improvements in apparatus and methods for forming or reconditioning leads of electronic components of the so-called dual-in-line package (DIP) devices.

BACKGROUND OF THE INVENTION

As is well known in the art, DIP devices consisting of a body portion, and attached and depending leads connected thereto for assembly into a PCB or the like, are manufactured with the leads disposed in a particular arrangement adapted for insertion in a predetermined array or pattern of holes or sockets constituting a portion of a circuit in a PCB. DIP leads are relatively fragile and frequently are bent or distorted during handling, shipping and manufacturing operations. Ideally, DIP leads are in general parallel alignment relative to a plane P-P transverse to its longitudinal axis referred to herein for convenience of understanding "side plane" and thus leads bent or distorted in this plane will be described as side plane lead disorientation. Ideally, leads are also aligned in rows generally parallel to or at a predetermined angle to a plane A-A through the longitudinal axis of the DIP. Thus, leads bent or distorted in this plane will be described as "end plane" lead disorientation. It has been found the end plane disorientation is more common than side plane disorientation and that in these instances only correction of the end plane disorientation is necessary to yield an acceptable DIP.

Side or end plane bent or otherwise distorted leads of DIP devices in any of a multiplicity of planes will prevent their insertion into the predetermined arrays or sockets in a PCB. A need has existed in the art for apparatus which will determine the integrity of DIP leads, i.e. formation and configuration with respect to a DIP, prior to insertion on a PCB. Not only has disorientation or integrity caused problems, but means are required to overcome any erroneous dispositions of the leads. Heretofore, as an example, lead straighteners have been developed such as that described in U.S. Pat. No. 3,880,205 METHOD AND APPARATUS FOR STRAIGHTENING ELECTRONIC COMPONENTS issued Apr. 29, 1975, and U.S. Pat. No. 4,481,984, entitled ELECTRONIC COMPONENT LEAD STRAIGHTENING DEVICE AND METHOD issued Nov. 13, 1984, also owned by the Assignee of the instant application. The apparatus shown in these patents operates to correct erroneous disposition of leads and/or straighten bent leads, by applying a combing action to the leads. Devices for determination of lead integrity constitue an invention described in patent application Ser. No. 648,872, entitled APPARATUS AND METHOD FOR LEAD INTEGRITY DETERMINATION FOR DIP DEVICES, filed Sept. 10, 1984, also owned by the Assignee of the instant application. The devices and methods as shown and described in the aforementioned patents and pending patent application serve specific purposes to correct orientation of leads in DIPs. While these prior apparatus were generally effective for the purposes intended, the capacity of the apparatus is dependent on the cycling speed of the straightening mechanism.

It has been found in previous apparatus that in order to ensure a perfect DIP device, having leads that are perfectly aligned axially as well as cross sectionally, and having leads of varying angles of divergence from 0° to some desired angle for the automatic handling machine or for manual insertion, that each DIP device entering the straightening machines from a client's packaging tube frequently needed individual lead correction manipulation and thereby slowing down the production rate.

A previous invention to increase the production rate was to install on existing "300" and "600" machines a scanning device that enabled the incoming DIP device to have its leads automatically, and at high speeds scanned by means of a light source, and incorporating a logic circuit, as disclosed in detail in said pending application Ser. No. 648,872. It has been found, as previously mentioned, that in most cases the percentage of DIPs that needed to be manipulated to achieve a client's maximum and minimum requirements or tolerances ran two to three percent of an entire order batch of DIPs. In addition, it was discovered that the production rate could be increased further due to the rapid functioning of the scanning system of the pending application which is capable of scanning and decision-making at the rate of about 10,000 units per hour. It was also determined that a factor which was slowing down production rate was the fact that the absolute precision generated by use of the known mechanical straightening device was not always required, and that minimum requirements of the client could be achieved by by-passing the mechanical combing and straightening device as disclosed in U.S. Pat. No. 4,481,984, and that the output of DIP handling apparatus is increased substantially by the novel forming mechanism and track switching mechanism of the present invention for lead straightening machines in the category of "600" up. The "300" class machines track switching mechanism was found to be capable, without redesign, of maintaining a high-output rate in combination with the scanning device and redesigned geometric forming station and mechanism due to the small throw of the "300" track switching mechanism.

The present invention constitutes a further improvement over such prior devices, and includes means for correcting out-of-plane lead orientation. Additionally, the present invention substantially increases in-plane lead damage detection rate and decreases substantially the potential for DIP hang-up or shingling thereby contributing to a substantial increase in DIP thru-put.

The present invention includes, in the overall machine, a novel geometric former employing flexible drive belts for propelling DIPs along a fixed track containing dimensionally adjustable detection and straightening means. The present device permits a vertical geometric alignment of the leads or a desired divergent angle (for example, 10°) which may be required for automatic or manual insertion in a connecting socket of a PCB or the like.

The divergence or spread of the lead permits automatic machinery to grasp the DIP and dispose it in a pattern on a PCB or the like. For example, the automatic handling apparatus generally comprise jaw members which frictionally engage the opposing outer side faces of the rows of leads of a typical DIP device and presses the leads slightly inwardly to a position generally 90° to the DIP body so that the rows on both sides are generally parallel for insertion in a socket opening in the PCB. The controlled selectively outward divergence of the leads produced by the forming mechanism of the present invention provides trouble-free pick-up manipulation by automatic handling equipment. For manual handling of DIPs the forming mechanism of the present invention may be set to align the rows at 90° generally parallel relationship and includes means for compensating for "spring-back" during the forming operation. Thus the intermediate angular disposition is so controlled as to accommodate different patterns and automatic handling machinery.

It has been found that DIPs as provided by different manufacturers will differ in the number or percentage of DIPs having misalignment in one of the plural planes of significance, and currently some manufacturers produce DIPs wherein only one or two percent of the DIPs will have such misalignment of leads necessitating correction, and/or rejection, depending upon the built-in errors of configuration. The present invention, utilizing the components therein and also the scanner means in the co-pending patent application, can correct errors as determined by the scanner for integrity in a side view of a DIP as it races by, and the present device is further capable not only of forming and scanning initially but thereafter subjecting the leads to further straightening actions if required, or rejecting DIPs containing such misalignment as to be non-correctable. The present invention provides means for rejecting DIPs containing non-correctable lead distortions. Typically a speed of 10,000 DIPs per hour of so-called "600" to "300" designated DIPs can be processed by the present invention.

SUMMARY OF THE INVENTION

Summarizing briefly, the purpose of the invention is to provide new and novel apparatus, structure and method for detecting and straightening leads of DIP devices and a new and novel high-speed accept/reject switching mechanism.

Considering briefly the basic components of the apparatus, the apparatus includes an elongated trackway, a DIP loading or supply station at the inlet end of the trackway where DIPs contained in standard elongated cartridges are positioned to discharge DIPs to the trackway and a plurality of stations along said trackway for performing scanning and straightening operations on the DIPs as they move through the apparatus. The main trackway terminates at its lower end in a plurality of discharge trackways and a novel switching trackway mechanism is provided for selectively directing DIP devices to one of the plurality of discharge trackways. Tubes for receiving the trackways are detachably mounted at each of the discharge trackways after processing in the apparatus.

Considering briefly the overall operation of the apparatus and method of the present invention, DIPs discharged from a cartridge at the loading station at the upper end of the trackway are gravity fed to the trackway for various operations at stations along the trackway. In the present instance the DIPs first enter a forming station which includes spring biased adjustable forming mechanisms wherein the leads of the DIP device are subjected to a compressive forming operation to form or flatten leads which may be bent at other than the desired angle to the longitudinal axis of the DIP device to correct for end plane disorientation which includes belt-type drive means for moving the DIP through the forming mechanism. As explained in more detail hereafter, the forming mechanism includes a set of cooperating rollers and anvils on opposite sides of the trackway which are adjustable in a direction transversely of the trackway to accommodate DIPs of different cross-sectional widths. The forming mechanism is also selectively adjustable angularly relative to a plane through the longitudinal axis of the DIP device to position the forming rollers and anvils at a preselected angle and thereby form the leads in rows disposed at a preselected angle relative to a plane through its longitudinal axis for ease and accuracy of handling in automatic handling equipment. A feature of the present invention is the spring biased arrangement of the rollers and anvils whereby the pressure applying relation between the anvils and rollers can be selectively varied and thereby accommodate leads which may be of slightly varying cross section without damaging the leads during a forming operation. This arrangement also accommodates for material variations such as solder or tinning build-up.

DIPs discharged from the forming station move down the trackway to a scanning station where the condition of the leads is analyzed to determine whether they are within tolerance in a direction transverse to its longitudinal axis, that is acceptable side plane orientation. If the leads require straightening in this plane, then a straightening mechanism downstream of the scanner is activated to perform a straightening operation on the DIP device at a lead straightening station. On the other hand, if the leads are deformed or bent in a manner so that straightening would result in damage to the leads, or there are missing leads, then the DIP device bypasses the straightening station and the switching track is signalled to direct the rejected DIP device to the discharge trackway for accumulating rejected DIP devices.

In the embodiment illustrated, the switching track mechanism directs DIPs selectively to one of three discharge trackways. A feature of the trackway switching mechanism is its rapid repositioning action characterized by a very small sideways displacement. Suitable sensing means are provided in the discharge trackways for sensing passage of DIPs to one of the three discharge trackways. Electronic interlocks are provided to prevent a DIP from leaving the forming station before the previous DIP has cleared the discharge station. Further, a suitable interlock switch means located at the discharge trackways is provided to sense the absence or presence of a collection cartridge at the discharge station. If no cartridge is present, system operation is inhibited.

With the foregoing in mind, it is an object of the present invention to provide a new and improved method and apparatus for automatic processing of electronic components, particularly DIPs of the type described above.

Another object of the present invention is to provide a method and apparatus including a novel forming mechanism having selectively adjustable biasing means for selectively varying the pressure applying relation between the forming mechanism and the leads thereby accommodating for various lead thicknesses or cross section and yet effectively forming the leads at a predetermined desired angle relative to a plane through the longitudinal axis of the DIP device without damaging the leads in the forming process.

Still another object of the present invention is to provide method and apparatus which is completely automatic and wherein the forming, straightening, and scanning operations and control means for directing the DIPs to a plurality of discharge stations is performed fully automatically without stressing or damaging the components of the DIPs.

A still further object of the present invention is to provide a novel switching mechanism for selectively directing the DIPs to one of a plurality of cartridges at the discharge end of the apparatus which has an operative stroke less than the width of the DIPs thereby providing for extremely high speed processing of DIPs.

It is a further objective of the present invention to provide a lead alignment within a tolerance of twice the thickness of an individual lead.

It is a further objective of the present invention to provide a new and novel high-speed switching device for accepting or rejecting DIP components.

BRIEF DESCRIPTION OF THE DRAWINGS

The accompanying drawings illustrate a preferred embodiment of the invention, and when taken together with the description, serve to explain the principles and the structure of the invention. In the drawings:

FIG. 4 is a stepped sectional elevational view taken on line 4—4 of FIG. 3 and showing the large driving sprockets and associated details and adjustment means therefor;

FIG. 5 is a fragmentary sectional plan view taken on line 5—5 of FIG. 4 showing details of construction relating to the adjustable driving sprocket blocks and link attached cam activated belt driven rotatable anvil engaging members;

FIG. 6 is a fragmentary sectional elevational view through the link and cam actuated belt-driven rotatable anvil members, as taken on line 6—6 of FIG. 5;

FIG. 7 is a sectional elevational view taken on lines 7—7 of FIG. 3 and showing details of the rotatable belt-driven infeed nip rolls;

FIG. 8 is an enlarged fragmentary bottom plan view of the electric motor drive connection to the two driving sprockets of the geometric forming device, and constituting the prime mover of the forming device;

FIG. 9 is a greatly enlarged fragmentary side elevational view of a conventional plastic encapsulated DIP;

FIG. 10 is a fragmentary bottom plan view of the DIP shown in FIG. 9, taken on line 10—10 of FIG. 9, and depicting transversely non-aligned leads, a condition correctable with the present invention;

FIG. 11 is a view similar to FIG. 10 but showing the DIP of FIG. 9 after having been worked on by the geometric former device section of the invention and showing a lead alignment not possible with any currently known devices;

FIG. 12a is an end elevational view of a DIP of a conventional plastic encapsulated DIP having divergent leads of varying offset wherein the angles of various leads differ so that they do not provide an accurate and consistent cross-sectional geometry;

FIG. 12b is a view similar to FIG. 12a, showing a DIP having less divergence of the leads but still having a similar inherent problem;

FIG. 12c again illustrates a DIP similar to that of FIG. 12a wherein the leads per se have been bent in a manner forming compound bends therein and creating an even greater degree of error and possible breakdown in use or application of a DIP in a socket of circuit forming means, the configuration unless eliminated being subject to numerous kinds of breakdowns in the units, pieces and equipment;

FIGS. 13a through 13c inclusive are illustrative of similar DIP devices to those illustrated in FIGS. 12a through 12c, but clearly showing the cross-sectional aligning ability of the geometric-forming device of the invention, and the infinitely controllable divergence of the DIP leads from 0°, preferably vertical as shown in FIG. 13c, to ever increasing lead divergences as shown in FIG. 12a, for example;

FIG. 19 is a perspective view of the forming mechanism of the present invention.

DETAILED DESCRIPTION OF THE PREFERRED EMBODIMENT

FIG. 1a shows the type of electronic component for which the apparatus and method of the present invention are particularly suited to form and straighten. These electronic components, commonly known in the trade as dual-in-line devices are hereinafter referred to as DIP devices. The DIPs are generally designated by the reference letter D and comprise an elongated generally rectangular body portion B made of a molded material such as a ceramic or plastic having imbedded therein a plurality of leads L having a shoulder S adjacent the body portion B which ideally are uniformly spaced and in an acceptable device are generally parallel to a plane P—P perpendicular to the longitudinal axis A—A. The leads L of an acceptable device are also aligned in a straight row and parallel or at a slight outward angle to a plane X—X transverse to the longitudinal axis A—A the body portion B for proper handling and insertion into the socket openings in an printed circuit board. Even though the method and apparatus of the present invention are particularly suited for straightening electronic components specifically of the type illustrated, it is, of course, to be understood that this is only by way of example and the apparatus and method may be employed for devices of various sizes as well as performing other operations.

Figure 1:
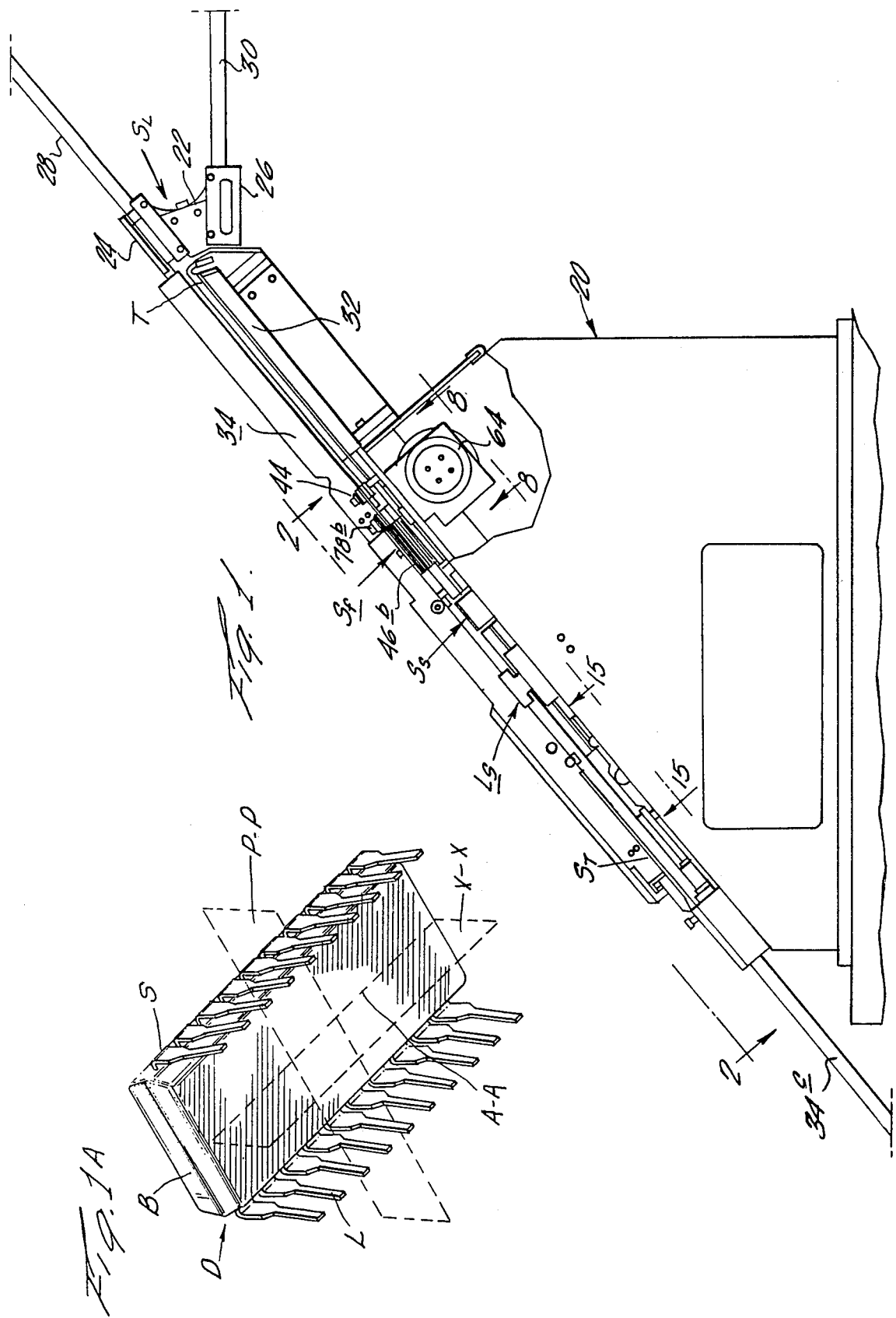
FIG. 1 is a side-elevational view of a preferred embodiment of the invention including a novel geometric lead forming device; scanning means; an additional lead straightening device and a high-speed DIP track selecting rejection or acceptance device.

The novel DIP forming mechanism and high speed switch track assembly of the present invention will be described hereinafter in conjunction with the description of the overall apparatus. A general understanding of the basic structure and operation of the apparatus including the novel forming and switch mechanisms may be gained by reference to several of the views which best show the basic components of the apparatus and the operation thereof such as FIGS. 1, 2 and 3. Considering first, however, the basic components of the entire apparatus in terms of function, the apparatus shown in FIG. 2 comprises a main housing 20 which mounts on an inclined front face thereof an elongated trackway T having a loading station $S_L$ at the upper terminal end of the trackway. As best illustrated in FIG. 1, the loading station $S_L$ includes a turret 22 comprising two tube sockets 24, 26. Into these sockets are inserted DIP carrying tubes containing DIPs to be checked for lead straightness. One of the DIP carrier tubes 28 is aligned axially with inclined trackway T, while the other DIP carrying tube inserted in socket 26 is held in reserve, and designated 30, so that as one tube is discharging DIPs for, the other can be filled and thereafter rotated with the trackway. DIPs are gravity fed along the trackway and when one tube is exhausted, rotation of the turret can align the reserve tube and the initial tube can be replaced or refilled with further DIPs.

DIPs to be processed discharge from the loading station $S_L$ directly to the upper end of the trackway T where as illustrated, for example in FIG. 4, the DIPs straddle the trackway so that their leads L are disposed on either side thereof and are frictionlessly retained by an axially aligned centrally located adjustable guide rail 34. The DIPs move down the trackway T by gravity for processing at various stations along the trackway including a forming station $S_f$. The basic components of the forming mechanism comprises a pair of forming heads 78a, 78b disposed on either side of the trackway which are adjustable in a direction transverse to the trackway to accommodate DIPs of various widths and are also adjustable angularly, as shown in FIG. 6, relative to a transverse plane X—X through the longitudinal axis A—A of the DIP for selectively cold forming or roll forming the leads at a predetermined desired angle of divergence A relative to the body portion of the DIP as explained in more detail hereafter. As illustrated in the drawings, the basic elements of the forming mechanism or heads are identical and accordingly, elements thereof are identified by the same reference numeral with "a" and "b" subscripts to indicate the left and right hand forming heads. Each forming head assembly consists of an anvil 90a, 90b and a rotatable roller 78a, 78b which are selectively spaced to define a nip gap G through which the leads L pass during the forming operation. The anvil and rollers are spring biased to provide a selectively variable compressive force in the nip gap G to effect the desired forming action for forming the leads so that they are aligned in a longitudinal row within predetermined tolerances preferably less than two times the cross sectional thickness of the DIP lead as illustrated in FIG. 11.

DIPs then proceed to the scanning station $S_s$ and depending upon the information interpreted by the scanning heads, the incoming DIP is generally allowed to proceed past a lead straightening device designated $L_s$, and proceed to a track switching device generally $S_t$ wherein the DIP is selectively diverted into either one of two acceptance tubes or rejected in a rejection tube. The receiving tubes are initially empty, and designated 34a, 34b and 34c. The individual tubes have been labeled in FIG. 2 for their function.

The track switching mechanism $S_t$ is characterized by novel features of construction and arrangement providing a high-speed switching capability among the three discharge trackways and thereby contributing to the overall high-speed efficiency and operation of the entire apparatus. As explained in more detail hereafter, the displacement is less than the width of the DIP for throwing the switch between the three limit positions.

Figure 2:
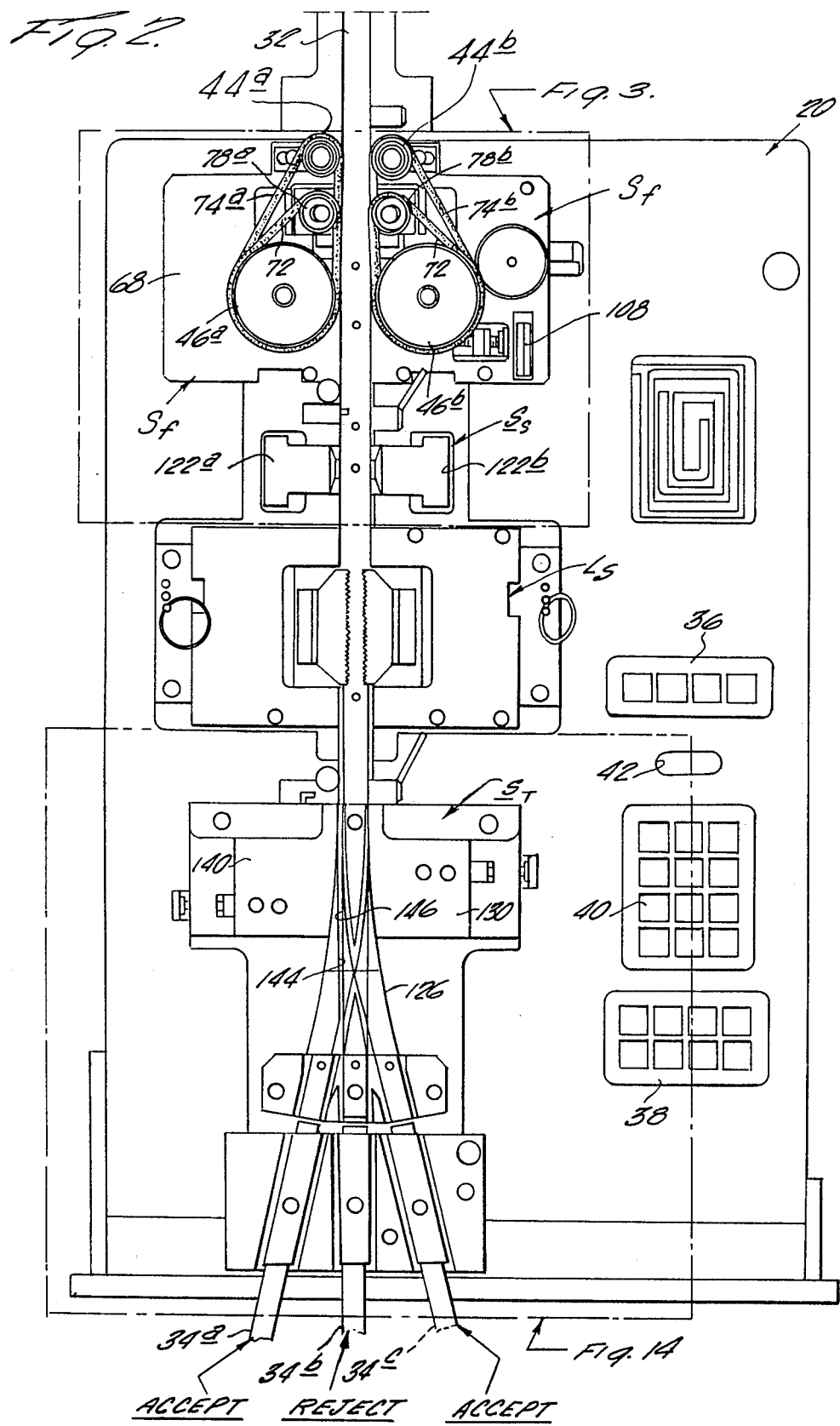
FIG. 2 is an enlarged fragmentary plan view taken on line 2—2 of FIG. 1, and showing various operating stations and an associated operator's control panel.

Referring to FIG. 2, in addition to the stations just described, there is clearly shown an operator's logic keyboard as previously described in the aforesaid patent application, Ser. No. 648,872, to which reference is made and the description incorporated herein by reference, for details thereof. Numeral 36 generally refers to the overall activation of the machine, for control of activation or deactivation of various mechanisms in the machine generally. A panel 38 includes activating control means for various lead components to be worked upon by the machine. Panel 36 is a control pad, 38 a data pad and 40 is a numeric pad and 42 is a numeric display. It is to be understood that the machine is manually set initially by the operator in accordance with the tolerances required by the client, and this is done by taking a sample or two of the DIPs provided and manually adjusting the machine and keying into the logic circuit the tolerances provided by the manufacturer. The relative positions of various drives and mechanisms are set in accordance with dimensions and tolerances of the DIPs to be processed. After this initial step, the machine is set for full automatic operation and normally functions at its full rate of operation.

Figure 3:
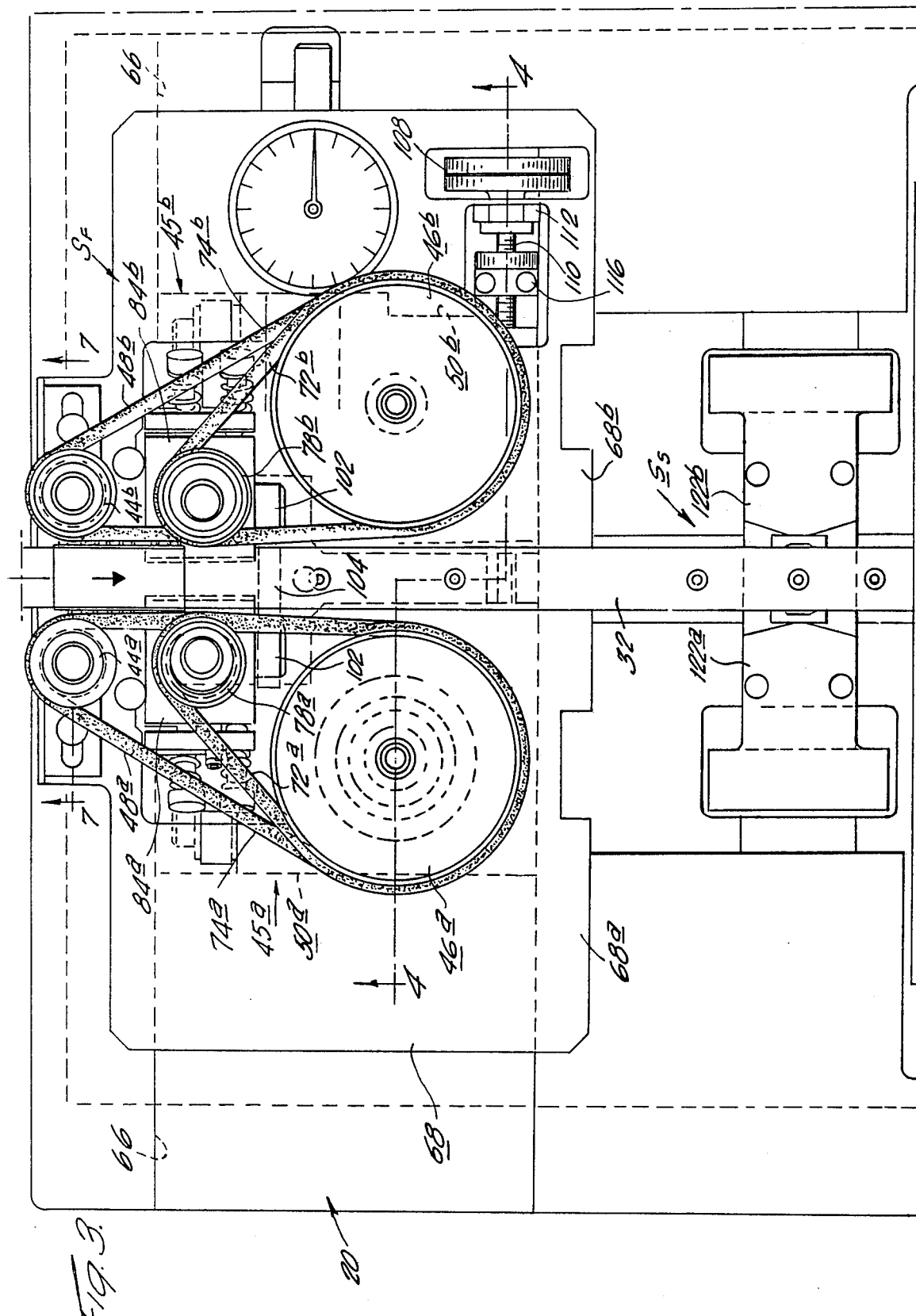
FIG. 3 is a greatly enlarged fragmentary plan view of the details contained within the borders of the dot and dash rectangular box of FIG. 2, and designated FIG. 3.

Considering now more specifically the details and structural arrangement of the forming mechanism at the DIP forming station $S_f$ and referring to FIGS. 2, 3 and 4, there is provided a pair of rotatably mounted nip rollers 44a, 44b which are selectively adjustable in a direction transverse to the trackway T and two complementary forming head assemblies 45a, 45b downstream of the nip rollers. The forming head assemblies include a pair of rotatably mounted forming rollers 78a, 78b and a pair of drive wheels 46a, 46b. A series of endless belts which engage in grooves in the nip rollers, forming rollers and drive wheels function to rotate the forming rollers and drive the DIP devices through the forming station $S_f$ in the manner described in more detail below. The drive wheels 46a, 46b as best shown in FIGS. 5 and 6 are mounted for rotation within two slide blocks 50a, 50b which are adjustable in a direction transversely of the trackway T and thereby the longitudinal axis $A_1$ of the DIP device to facilitate DIPs of varying widths. The drive wheels 46a, 46b are mounted on shafts 52a, 52b supported in bearings 54a, 54b. As illustrated, the shafts mount worm gears 56a, 56b cooperatively associated with worm drives 58a, 58b (shown in FIG. 8) which in turn are attached to a common shaft 60 connected by means of a coupling 62 to an electric drive motor 64. Motor 64 in turn is supported on the underside of the operator's face plate as shown in FIGS. 1 and 8. The drive system described provides the means for moving the DIPs into the forming station and rotating the forming rolls.

With further reference to FIG. 2, an incoming DIP, after exiting the tube 28, straddles the track 32 and first engages a set or pair of prepositioned nip rollers 44a, 44b which are belt driven by means of a pair of large diameter drive wheels or rollers 46a, 46b by means of an interconnecting belt drive 74a, 74b. The oncoming DIPs are in physical following engagement one with another up to this point. Once having been engaged by the nip rollers 44 and more particularly the belts 74a, 74b relative velocities of the DIPs are changed and a spacing of one DIP with respect to another is created. The geometric forming station $S_f$ is best shown and described in detail with reference to FIGS. 2-8 inclusive. As shown in FIGS. 5 and 6, the driving wheels 46a, 46b are mounted for rotation within two slidable blocks 50a and 50b, which have rotatably driven shafts 52a and 52b mounted in bearings 54a and 54b. The shafts 52a, 52b have non-rotatably attached to their upper terminal ends the geometric former drive wheels 46a, 46b and to their lower terminal ends worm gears 56a, 56b. These worm gears in turn are driven by the worm drives 58a and 58b which are attached to a common shaft 60, and interconnected by means of a coupling 62 to an electric motor 64. Motor 64 is attached to the underside of the operator's face plate as shown in FIGS. 1 and 8. This provides the driving means for the forming mechanism and allows for a change in relative speeds.

The slide housing has two elliptically-shaped apertures 56c to allow for linear displacement of the worm gears 56a, 56b. In addition it provides a channel 66 in its upper face, that retains the slidable blocks 50a, 50b for adjustment in and away from the center line of the trackway 32. The channel 66 containing the slidable blocks 50a, 50b are retained from upward displacement by means of a cover plate 68. The former driving wheels 46a and 46b have a plurality of circumferentially extending grooves 70 in which are mounted drive belts 72a, 72b and 74a, 74b and a lowermost circumferentially endless belt 76a, 76b. The upper belts 72 drive a pair of forming rollers 78a, 78b while the belts 74a, 74b drive the nip or entrance rollers 44a, 44b.

As shown in FIG. 7, the DIPs are engaged only by the resilient belts 74a, 74b of the nip rollers 44a, 44b and engage the DIP the leads L slightly below the shoulder S, i.e. the insertable area of the leads, to advance them through the forming station. As the DIPs move along the trackway under the influence of the belts 74a, 74b they enter into the forming station $S_f$ consisting of the forming rolls 78a, 78b, (FIG. 6), driven by belt 72a, 72b and pivotally mounted by means of a link 80a, 80b. Upwardly biased spring elements 82a, 82b coact between the link 80a, 80b and upper brackets 84a, 84b. The brackets 84a, 84b have downwardly extending flanges 86a, 86b which pivotally secure the bracket 84a, 84b to the link 80a, 80b at the pivot point 88a, 88b. The brackets 84a, 84b also form a fixed axis of rotation for the former rolls 78a. The brackets 84a, 84b carry upon their inner faces anvil members 90a, 90b which are spring biased against the inner face of the brackets 84a, 84b by means of springs 92, shown in FIGS. 5 and 6 as being captured between the mounting bolts 94 and adjustment plate 96. The opposite ends of the links 80a, 80b are pivotally secured to the sliding blocks 50a, 50b. They also mount small pins 98 which enter into apertures 100 in the blocks 50a, 50b whose purpose is to force the links 80a, 80b in a downwardly direction so that the inner ends of links 80a, 80b are pivotally secured to the brackets 84a, 84b and serve to also carry cam followers 102 which cooperate with a cam track or member 104. The central portion of cam track 104 is planar and flat, and has outer terminal ends forming upwardly arcuate faces 103a, 103b. As the blocks 50a, 50b are moved away from the track, the resultant motion imparted to the rollers 78a, 78b creates a tilting or angular divergence to either side of the trackway T due to the compression spring 82a, 82b inserted between the brackets 84a, 84b and links 80a, 80b and the point of pivot created by the pivot blocks 106a, 106b fixedly secured to the brackets 84a, 84b by screw fasteners 113, which bear against a centering post 109 under the trackway T and which form a pivot point for the forming rollers. Specifically, the pivot blocks bear directly on the centering post or tab 109 and thereby ensure against loading of the anvils 90a, 90b and thus permit free floating movement of the forming rollers 78a, 78b against the spring bias. Note the lower section of the trackway T is cut away at the forming station (FIGS. 6 and 19) to prevent binding engagement of the anvils 90a, 90b against the trackway and ensure proper adjustments of the forming rollers 78a, 78b and the anvils 90a, 90b and slight adjustments of the nip gap G which compensates for lead variations. The purpose of the cam follower and cam track is such that they will impart an upward direction to the forming heads so that the upper edges of the anvils 90a, 90b, whether vertical or inclined, will always lie directly below the trackway T and maintain a maximum engagement to the DIP leads adjacent the shoulder S as shown. This will ensure that regardless of the angle of divergence, the DIP leads will have a common point of bending. Note that the arrangement provides a cold forming or roll forming action in the nip gap G whereby the leads L are engaged between the forming rollers 78a, 78b and anvils 90a, 90b form a point adjacent the shoulder S to its terminal end, in other words substantially the entire insertable area of the leads L.

In addition, means are provided for the independent spacing of the slidable blocks 50a, 50b which each carry all the previously described mechanism. This is necessary in order to ensure that the DIP body is truly centered upon the trackway so that the resultant divergence or non-divergence of the lead is truly symmetrical about the DIPs cross-sectional center axis $A_L$. To this end, FIG. 5, the blocks 50a, 50b can be moved toward or away from each other by means of an adjustment wheel 108. Shaft 110 is rotatably mounted in brackets 112, carrying adjustable nut 114, and lockable by means of bolts 116 secured to a bracket 118, which in turn is fixedly mounted to slidable block 50b. The wheel 108 will rotate shaft 110 and dependent upon the direction of rotation draws the blocks 50a, 50b towards or away from the centerline of track T. In addition shaft 110 extends slidably or freely through the block 50b, and has a terminal threaded end 120 which is threadedly engaged in block 50a. This arrangement provides for the forming heads 78a, 78b to be individually adjusted, or simultaneously adjusted so that the centering with respect to the centerline of the trackway T is appropriate to the work desired to be done on the individual lead.

With particular reference to the foregoing description of the geometric forming mechanism, a typical forming operation will be described hereinafter. If, for instance, a DIP such as one shown in FIG. 12c, having leads which have compound bends as well as misaligned leads, proceeds down the trackway to the nip rollers 44a, 44b of the geometric forming device, the leads are engaged by the belts 74a, 74b. The belts guide the oncoming DIP at a determined speed wherein the leads first come into engagement with the pivot blocks 106a, 106b. These present angular beveled faces 107a to the oncoming leads, tending to spread any leads that were bent slightly inwardly under the track, and are now moved outwardly under the influence of the pivot blocks 106a, 106b. As best illustrated in FIG. 19, the anvils are also beveled as at 111a, 111b at the juncture of the pivot blocks to define a stepped configuration to further deflect inwardly bent leads L outwardly and position them for passage through the nip gap G. While still under the influence of the driving belts 74a, 74b the DIP proceeds a short distance until it again engages second inclined faces 111a, 111b of the ultimate anvils 90a, 90b which tend to impart to the leads the proper angle of divergence. As the leads L pass between the rotating forming roller 78a, 78b and the anvils 90a, 90b there will exist a preset gap G at the point of tangency of the spreader roll circumference and a lead of the DIP that in turn is supported and backed by the anvils 90a, 90b. This interaction ensures the proper angle of divergence of each lead, the removal of any inherent compound bending of the lead and further ensures that each of the following leads will fall within a common plane. In reality, this alignment is maintained within a tolerance of twice the thickness of a DIP's lead. In the case of a DIP as shown in FIG. 12c, wherein some of the leads have compound bends, and the lead material is of relatively high strength, the former rollers yield against the spring bias of spring members 92a, 92b coacting with heads 94a, 94b to provide an adjustable compressive force of the roller against the DIP passing thereby. The adjustability of the spring force can prevent jamming of the machine or breakage of lead portions, etc. as will be understood. The tension of the spring members 92a, 92b is adjustable to compensate for different materials in the leads of the DIPs such as, for example, copper, steel, etc. Dependent upon the strength of the materials involved, and in order to ensure against faulty operations, it is possible to include more than one forming station or successive sets of forming rolls, and these can collectively eliminate bends in materials of high strength.

The drive wheels 46a, 46b carry a third endless belt 76a, 76b which is preferably of square cross section and which, as illustrated, is adapted to engage the leads L adjacent their terminal ends. These belts 76a, 76b also protrude a greater distance into the path of the DIPs and present a flat face engaging the leads over a substantial portion of their length to effect a slight bending action from the shoulder S. The spacing of the belts 76a, 76b is designed to impart a slight inward uniform bending action to the DIPs to compensate for so-called "spring back".

Upon leaving the forming station $S_f$, the DIP proceeds down the trackway and its leads L are examined or scanned at high speeds by the scanning heads 122a, 122b, where the leads are examined for straightness, or any missing leads, or other integrity factors such as overlapping leads. Note that the belts 76a, 76b are slightly outwardly divergent downstream of the forming station (FIG. 3) to impart an accelerating action to the DIPs as they discharge the forming station and thereby ensure against "shingling" which is a term used to describe DIPs which are interlocked at their confronting ends which can occur with some DIP configurations. Having passed this station, they will proceed through the straightening station $L_s$ where further work can be accomplished therein, dependent upon the logic circuit which would show the need for additional straightening at the scanning station. The lead straightening station $L_s$ may comprise a lead straightener mechanism of the type shown and described in U.S. Pat. Nos. 3,880,205 and 4,481,984 incorporated herein by reference which generally includes a pair of movable jaw members which comb the rows of leads on either side and effect straightening thereof so that they are generally aligned parallel to one another and to a plane P extending transversely to the longitudinal axis A—A of the DIP. If no further straightening or other adjustment is required, the DIP is allowed to proceed to the track switching station or device $S_t$ wherein it will enter one of three tubes as previously described.

Figure 17:
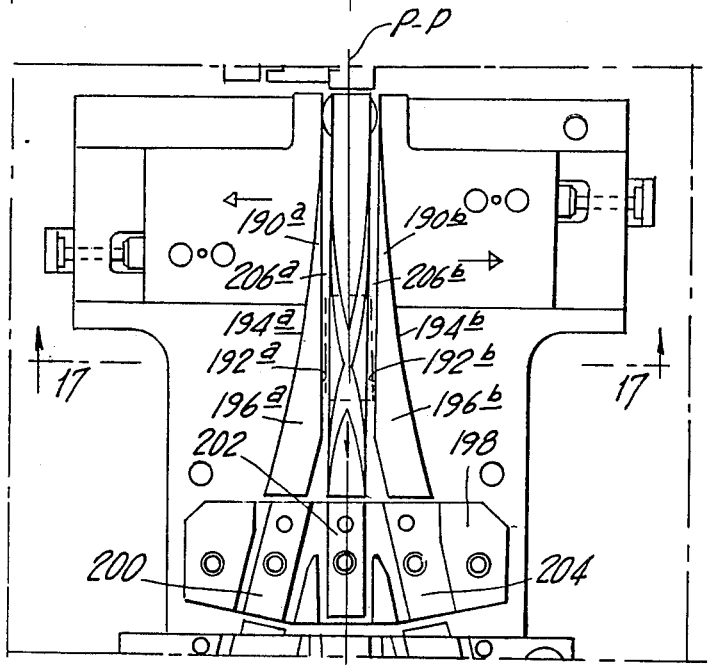
FIG. 17 is a fragmentary plan view of the track switching mechanism in another limit position.
Figure 18:
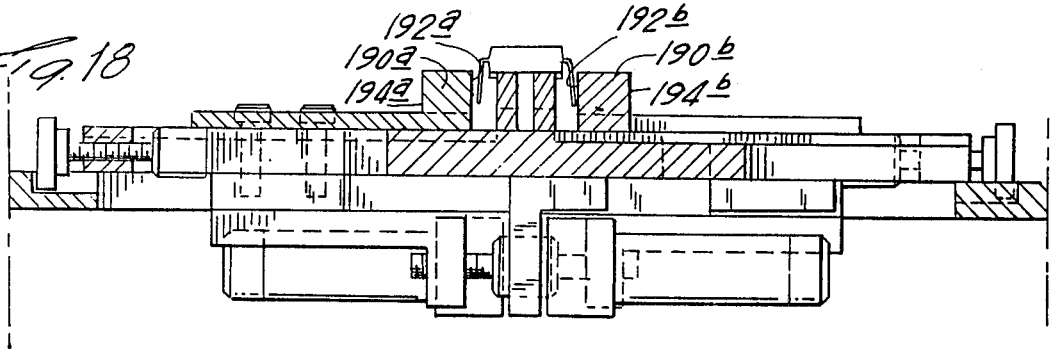
FIG. 18 is a sectional view taken on lines 18—18 of FIG. 17.

DIPs exiting the straightening station $L_s$ are either an acceptable DIP or a reject as determined by the scanner and are directed to a tube for rejects or accepted tubes for DIPs in tolerance by novel switching mechanism in accordance with the present invention. The track switching mechanism $S_t$ comprises a fixed central track section 180 aligned with the lower terminal end of the trackway T and with the central reject track section 180 at the discharge station. The fixed track section 180 as illustrated has an X-shaped groove arrangement formed in its upper face defining cross-over track grooves 182 and 184. The switch track mechanism $T_s$ also includes switch track members 186, 188 movable over a comparatively short stroke which is less than the width of a DIP relative to the fixed trackway T and in a direction transverse thereto for selectively controlling movement of the DIPs to one of the three discharge stations $S_{d1}$, $S_{d2}$, $S_{d3}$. Each switching trackway section 130, 140 as illustrated includes an upstanding rail portion 190a, 190b having an elongated straight inner face 192a, 192b parallel to the central axis P—P of the trackway and an arcuate outer face 194a, 194b which merges at its upper end closely adjacent the inner face and as illustrated at the lower discharge end has a discharge track section 196a, 196b which aligns with a fixed plate 198 having the three intermediate trackways 200, 202, 204 connecting with the discharge trackways. Actuating means described in more detail below is provided for positioning the switching trackways between a first position (FIG. 17) wherein the inner faces 192a, 192b are equispaced relative to the center of the trackway T and define with the fixed trackway parallel grooves 206a, 206b for directing the DIP devices to the central reject station as best illustrated in FIG. 17. The trackway sections are actuatable to a second limit position illustrated in FIG. 14 wherein the trackway sections 130 and 140 are positioned at their extreme position to the left so that the DIP exiting the main trackway T is now directed to the discharge station $S_{d1}$. Actuation to the opposite limit position that is to the right, of course, directs the DIP to the discharge station $S_{d2}$.

Figure 15:
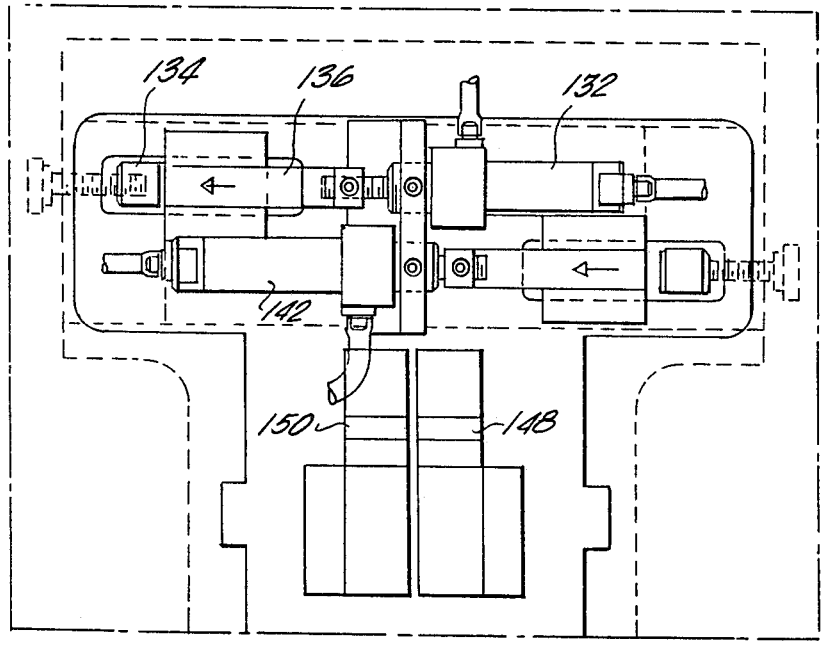
FIG. 15 is a fragmentary bottom plan view taken on line 15—15 of FIG. 1, showing air-operated cylinders and associated solenoids utilized in the track switching mechanism of the invention.
Figure 16:
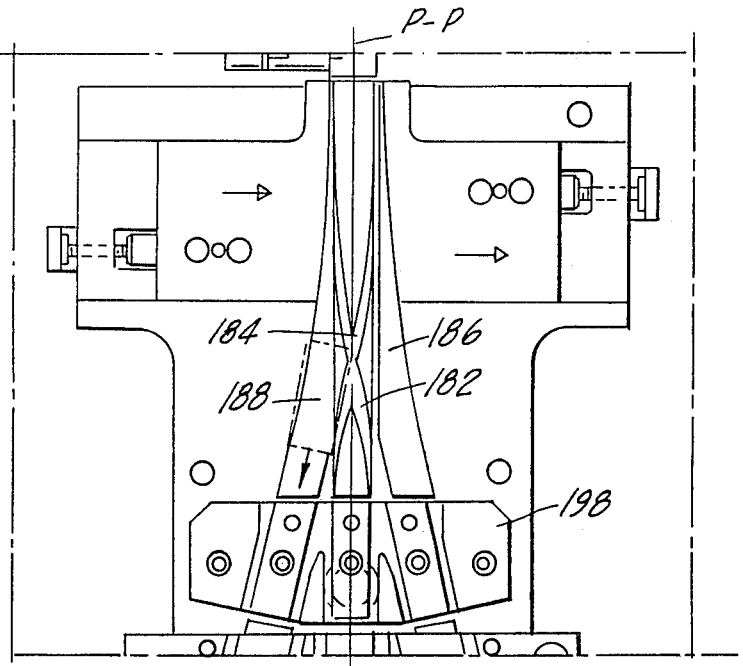
FIG. 16 is a fragmentary plan view of the track switching mechanism showing one limit position to direct DIPs to one of a plurality of collection tubes or cartridges.

The track switching actuating mechanism includes as best illustrated in FIG. 15 air-operated actuator cylinders 132 and 142 for the track switching sectors or members 130 and 140 respectively. For example, track sector 130 is controlled by air-operated cylinder 132 which is operatively associated with a stop member 134 engageable by actuator member 136. Likewise, movement of switch track member 140 is under the control of air-operated cylinder 142, actuator member 143 and stop member 145. Note that the stop members are selectively adjustable to control the precise inner and outer limit positions of the track sectors 130 and 140. Likewise the air-operated actuators are operatively connected to the track sectors by suitable means.

The fixed triple discharge track section of the switch track mechanism $T_s$ includes three sensors 220 which are operatively associated with the forming station motor actuator so that the system functions to discontinue operation at the forming station in the event that there is more than one DIP along the trackway. In other words, the system is synchronized in such a manner to prevent accumulation of a plurality of DIPs along the trackway which may jam operation of the apparatus.

Figure 14:
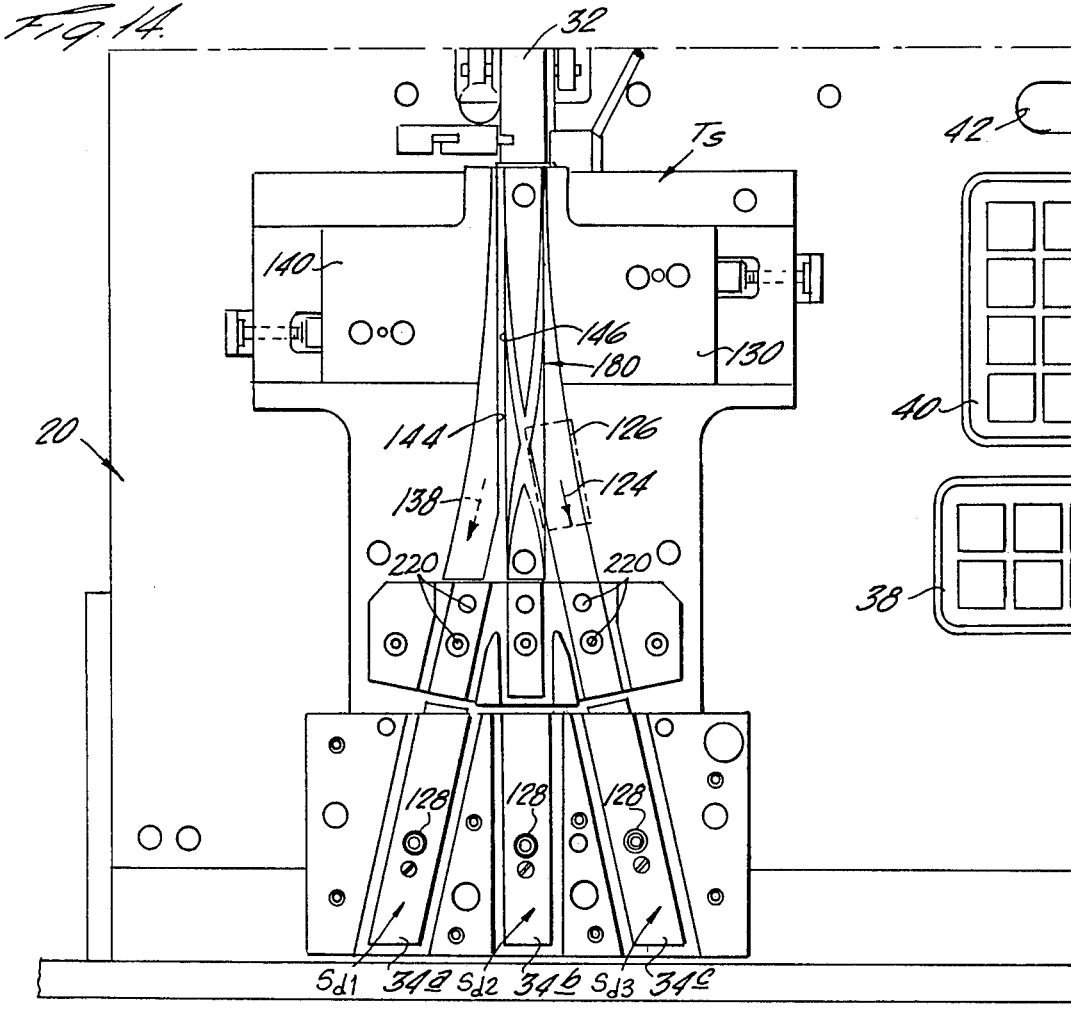
FIG. 14 is a fragmentary plan view of high-speed track diverting mechanism contained within the dot and dash box or rectangle as shown in FIG. 2 and designated FIG. 14.

With particular reference to FIG. 14, a DIP would be diverted from the centrally aligned trackway T toward the right as shown by arrow 124, the outside leads of the DIP following the contour of the arcuate edge 126. In this instance, the DIP would enter an empty tube inserted in socket 34c, and all other DIPs following this particular one which are acceptable would likewise follow this route until the tube is completely filled and an indicator light 128 is lit. At this instant, the track switching mechanism is logically controlled so that track member 130 would move to the right under the influence of the air operated cylinder 132 until a stop 134 is engaged by actuator member 136. If, for instance, succeeding following DIPs have been determined as proper in all respects, they will be diverted to the left, as shown by the dot and dash arrow 138, where they will enter into an empty tube operatively engaged in socket 34a and this action will continue until this tube is filled as previously defined with respect to tube 34c.

In order to facilitate this operation, track switching member 140 would be moved toward the right under the influence of an air cylinder 142 until the inner edge 144 of the trackway 140 engages the outer face 146 of the central trackway. This condition of switching from the left to the right, or vice versa, of the trackway switching means will continue as long as the oncoming DIPs are acceptable and allows for the manual replacement of the filled tubes which is indicated visually by means of indicator lights such as 128. Further, it is understood that the DIPs entering these accepted tubes are under the control of the logic circuitry which, in turn, dictates action to solenoid operated air valves such as at 148, 150.

If a DIP is to be rejected, or unacceptable, as determined by the scanning heads means, both the switch track shifting members 130 and 140 will move outwardly, i.e. away from the center line of the trackway 32, whereby the oncoming DIP is guided by the straight inner faces 192a, 192b to proceed centrally down and into a rejection tube located in socket 34b. When filled to capacity, a lamp such as 128 will light, and a new empty tube is then installed or inserted. Under circumstances hereinbefore described, where only a very small percentage of the DIPs will be rejected, a substantial period of time might elapse before a rejection tube is filled and needs replacement.

Removal of filled tubes and replacement by empty ones, timewise, will depend upon the speed of DIPs passing down the trackway, and under the high speed conditions of this machine preferably will include automatic devices, now shown, to so change tubes.

The foregoing description and accompanying drawings disclose details of preferred embodiments of the invention. Manifestly minor changes can be effected therein without departing from the spirit and scope of the invention, and such minor changes and embodiments are to be considered as within the scope of the invention as defined in the claims.

What is claimed is:

1. A forming station in a DIP handling apparatus operable to align leads in predetermined orientation and at a predetermined angle relative to the body portion, the leads having a shoulder adjacent the body portion, said handling apparatus including a trackway for operatively supporting and moving DIPs therealong from a loading station to a discharge station, said forming station positioned along said trackway subsequent to said loading station comprising laterally spaced rotatable forming rollers on opposite sides of said trackway, anvil means confronting the inner faces of said leads, said rollers and anvil means having cooperating confronting surfaces adapted to engage the DIP leads adjacent the shoulder to the outer terminal ends, said forming rollers cooperatively associated with said anvil means and spaced therefrom to define a nip gap, selectively variable pressure-applying means mounting the forming rollers and anvil means relative to one another which normally urges the cooperating surfaces toward one another and permits a continuously variable nip gap adjustable as determined by the leads passing through the nip gap and means for moving DIPs through said nip gap.

* * * * *